United States Patent
Okuyama et al.

(10) Patent No.: US 10,303,149 B2
(45) Date of Patent: May 28, 2019

(54) INTELLIGENT FUNCTION UNIT AND PROGRAMMABLE LOGIC CONTROLLER SYSTEM

(71) Applicant: Mitsubishi Electric Corporation, Tokyo (JP)

(72) Inventors: Takumi Okuyama, Tokyo (JP); Naotoshi Sakamoto, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 155 days.

(21) Appl. No.: 15/536,181

(22) PCT Filed: Jan. 28, 2015

(86) PCT No.: PCT/JP2015/052398
§ 371 (c)(1),
(2) Date: Jun. 15, 2017

(87) PCT Pub. No.: WO2016/121038
PCT Pub. Date: Aug. 4, 2016

(65) Prior Publication Data
US 2018/0329388 A1   Nov. 15, 2018

(51) Int. Cl.
*G05B 19/05* (2006.01)
*G01R 31/317* (2006.01)
(Continued)

(52) U.S. Cl.
CPC ..... *G05B 19/054* (2013.01); *G01R 31/31705* (2013.01); *G05B 19/0428* (2013.01);
(Continued)

(58) Field of Classification Search
CPC .... G05B 19/056; G05B 19/054; G05B 19/05; G05B 2219/13142
(Continued)

(56) References Cited

U.S. PATENT DOCUMENTS 5,452,437 A * 9/1995 Richey .................... G06F 11/22
                                                                   712/25
5,485,590 A   1/1996 Hyatt et al.
(Continued)

FOREIGN PATENT DOCUMENTS

JP   4-153705 A   5/1992
JP   08-095818 A   4/1996
(Continued)

OTHER PUBLICATIONS

International Search Report for PCT/JP2015/052398 dated Apr. 21, 2015.
(Continued)

*Primary Examiner* — Brian T Misiura
(74) *Attorney, Agent, or Firm* — Sughrue Mion, PLLC; Richard C. Turner

(57) ABSTRACT

An intelligent function unit includes an input selector selecting, as an input signal, an actual input signal or a simulated input signal generated in advance; an output selector selecting whether to output an output signal to the second controlled device; and a calculator causing an input/output controller in which combination and order of use of general circuit blocks are set to process the input signal one step at a time and transmit the output signal to an engineering tool or causing the input/output controller in which combination and order of use of the general circuit blocks are set to process the input signal consecutively for a set period of two or more steps, store the output signal for each step in a logger, and transmit an output signal corresponding to the set period and stored in the logger to the engineering tool.

8 Claims, 14 Drawing Sheets

(51) Int. Cl.
*H03K 19/177* (2006.01)
*G05B 19/042* (2006.01)

(52) U.S. Cl.
CPC . *H03K 19/17728* (2013.01); *H03K 19/17748* (2013.01); *G05B 2219/23283* (2013.01)

(58) Field of Classification Search
USPC .......................................................... 710/38
See application file for complete search history.

(56) References Cited

U.S. PATENT DOCUMENTS

| | | | |
|---|---|---|---|
| 5,754,823 A | 5/1998 | Mudryk, Jr. et al. | |
| 5,777,489 A | 7/1998 | Barbier et al. | |
| 6,057,706 A | 5/2000 | Barbier et al. | |
| 6,265,894 B1 | 7/2001 | Reblewski et al. | |
| 6,388,465 B1 | 5/2002 | Barbier et al. | |
| 6,717,433 B2 | 4/2004 | Barbier et al. | |
| 7,200,448 B2 * | 4/2007 | Cachat | G05B 19/0426 700/17 |
| 7,822,896 B1 | 10/2010 | Sagues et al. | |
| 8,756,041 B2 * | 6/2014 | Maturana | G05B 17/02 703/7 |
| 8,839,193 B1 * | 9/2014 | Devane | G06F 8/35 717/104 |
| 8,892,218 B2 * | 11/2014 | Shah | G05B 19/0426 700/12 |
| 8,930,880 B2 * | 1/2015 | Weatherhead | G05B 19/0426 717/100 |
| 9,477,578 B2 * | 10/2016 | Yamaoka | G05B 19/05 |
| 9,542,574 B2 * | 1/2017 | Kawaguchi | G06F 21/31 |
| 9,727,442 B2 * | 8/2017 | Kawasaki | G06F 3/0484 |
| 2002/0119706 A1 | 8/2002 | Sagues et al. | |
| 2004/0178820 A1 | 9/2004 | Barbier et al. | |
| 2005/0130459 A1 | 6/2005 | Sagues et al. | |
| 2005/0222696 A1 | 10/2005 | Ozaki et al. | |
| 2006/0155900 A1 | 7/2006 | Sagues et al. | |
| 2007/0220337 A1 * | 9/2007 | Itoh | G06F 11/321 714/30 |
| 2007/0255879 A1 | 11/2007 | Sagues et al. | |
| 2008/0204072 A1 | 8/2008 | Sasao et al. | |
| 2011/0231176 A1 | 9/2011 | Sagues | |
| 2012/0099239 A1 | 4/2012 | Sagues et al. | |
| 2015/0248509 A1 | 9/2015 | Sagues | |
| 2016/0004242 A1 * | 1/2016 | Yamaoka | G05B 19/056 700/87 |
| 2016/0078990 A1 | 3/2016 | Sagues et al. | |

FOREIGN PATENT DOCUMENTS

| | | |
|---|---|---|
| JP | 08-185339 A | 7/1996 |
| JP | 09-146616 A | 6/1997 |
| JP | 11-504736 A | 4/1999 |
| JP | 2000-105781 A | 4/2000 |
| JP | 2002-544576 A | 12/2002 |
| JP | 2005-275938 A | 10/2005 |
| JP | 2006-294005 A | 10/2006 |
| JP | 2007-058813 A | 3/2007 |
| JP | 2009-518728 A | 5/2009 |
| KR | 10-2006-0002739 A | 1/2006 |

OTHER PUBLICATIONS

Communication dated Nov. 19, 2018, issued by the Korean Intellectual Property Office in corresponding Korean Application No. 10-2017-7020746.

* cited by examiner

INTELLIGENT FUNCTION UNIT AND PROGRAMMABLE LOGIC CONTROLLER SYSTEM

CROSS REFERENCE TO RELATED APPLICATIONS

This application is a National Stage of International Application No. PCT/JP2015/052398 filed Jan. 28, 2015, the contents of all of which are incorporated herein by reference in their entirety.

FIELD

The present invention relates to an intelligent function unit that implements functions by combining general circuit blocks and to a programmable logic controller system that includes the intelligent function unit.

BACKGROUND

An intelligent function unit that is a type of unit included in a programmable logic controller combines general circuit blocks such as a clock, a counter, a comparator, a selector, and a logic gate to implement various functions required for input/output control such as a pulse count, a frequency measurement, a timer, and pulse width modulation output.

The intelligent function unit requires a debug function to verify whether the functions implemented by the combination of the general circuit blocks have an error.

Patent Literature 1 discloses a technique of comparing, in a reconfigurable circuit, a signal pattern regarded as a simulated user signal with sequentially output snapshots of logic elements to monitor the internal state of the logic elements.

Patent Literature 2 discloses a technique of changing the system clock and the address of a shift register in the reconfigurable logic cell array to acquire output of a given logic cell at a given point in time.

CITATION LIST

Patent Literature

Patent Literature 1: Japanese Patent Application Laid-Open No. 2002-544576
Patent Literature 2: Japanese Patent Application Laid-Open No. H8-95818

SUMMARY

Technical Problem

The invention disclosed in Patent Literature 1 is configured such that every logic element equivalent to the general circuit block is accompanied with a register, a memory, a network circuit, and a trigger circuit, and this thus increases the circuit scale. Moreover, the literature does not disclose displaying the debugging result of a product equipped with the reconfigurable circuit.

The invention disclosed in Patent Literature 2 requires a test circuit and a control input terminal in the logic cell equivalent to the general circuit block, and this thus increases the circuit scale. Moreover, the literature does not disclose displaying the debugging result of a product equipped with the reconfigurable circuit.

The present invention has been made in view of the above and an object of the invention is to obtain an intelligent function unit that can display the debugging result of a reconfigurable circuit while preventing an increase in the circuit scale.

Solution to Problem

In order to solve the above problems and achieve the object, an aspect of the present invention is an intelligent function unit that includes an input/output controller reconfigurable by changing a combination and an order of use of a plurality of general circuit blocks and that causes the input/output controller to process an actual input signal input from a first controlled device and outputs an output signal to a second controlled device. The intelligent function unit includes: an input selector to select, as an input signal, either the actual input signal or a simulated input signal generated in advance; an output selector to select whether to output the output signal to the second controlled device; and a calculator to cause the input/output controller in which the combination and the order of use of the general circuit blocks are set to process the input signal one step at a time and transmit the output signal to an external device or to cause the input/output controller in which the combination and the order of use of the general circuit blocks are set to process the input signal consecutively for a set period of two or more steps, store the output signal for each step in a logger, and transmit an output signal corresponding to the set period and stored in the logger to the external device.

Advantageous Effects of Invention

According to the intelligent function unit according to the present invention, an effect is obtained in that the debugging result of the reconfigurable circuit can be displayed while the circuit scale is prevented from increasing.

DESCRIPTION OF EMBODIMENTS

An intelligent function unit and a programmable logic controller system according to embodiments of the present invention will now be described in detail with reference to the drawings. Note that the present invention is not to be limited to the embodiments.

First Embodiment

Figure 1:
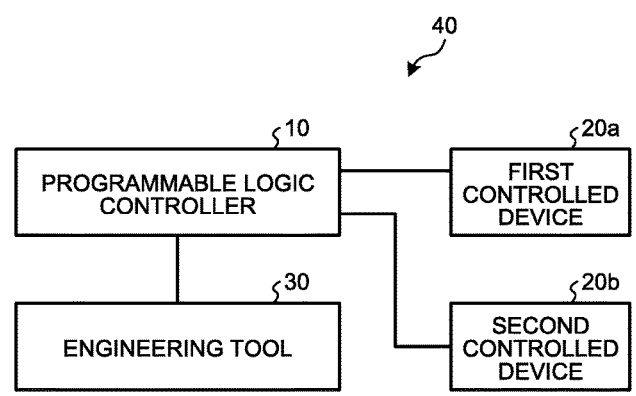
FIG. 1 is a diagram illustrating the configuration of a programmable logic controller system according to a first embodiment of the present invention.

FIG. 1 is a diagram illustrating the configuration of a programmable logic controller system according to a first embodiment of the present invention. A programmable logic controller system 40 includes a programmable logic controller 10, which controls a first controlled device 20a and a second controlled device 20b; the first and second controlled devices 20a and 20b, which are controlled by the programmable logic controller 10; and an engineering tool 30, which performs setting of the programmable logic controller 10.

Figure 2:
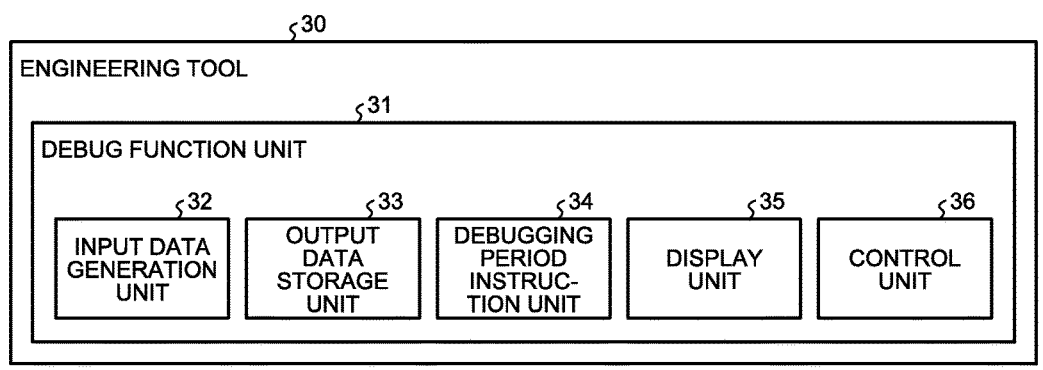
FIG. 2 is a diagram illustrating the configuration of an engineering tool in the programmable logic controller system according to the first embodiment.

FIG. 2 is a diagram illustrating the configuration of the engineering tool in the programmable logic controller system according to the first embodiment. The engineering tool 30 includes a debug function unit 31, which debugs the programmable logic controller 10. The debug function unit 31 includes an input data generation unit 32, which generates a simulated input signal as a substitute for an actual signal; an output data storage unit 33, which stores data received from the programmable logic controller 10; a debugging period instruction unit 34, which instructs the programmable logic controller 10 about a debugging period; a display unit 35, which displays a debug screen on a display (to be described later); and a control unit 36, which has overall control of a debug operation.

Figure 3:
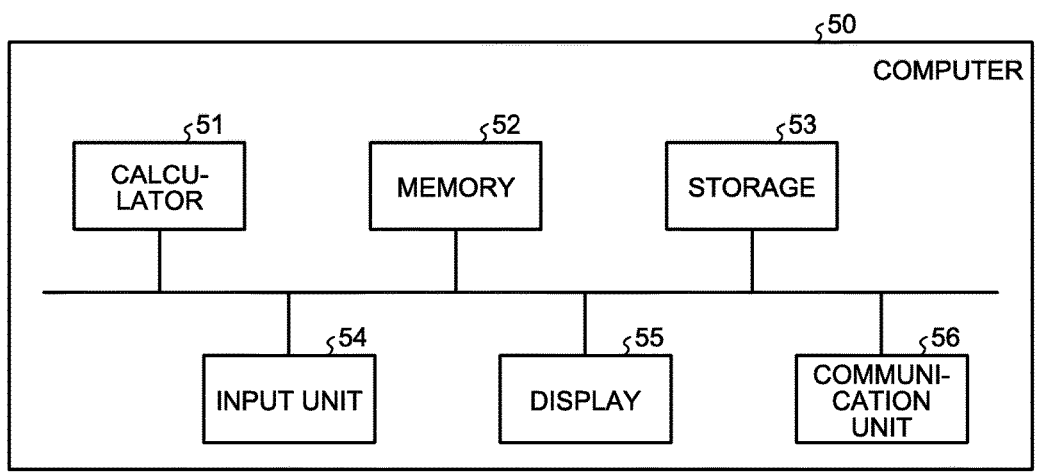
FIG. 3 is a diagram illustrating a hardware configuration of a computer that runs an engineering tool program in the programmable logic controller system according to the first embodiment.

The engineering tool 30 is implemented when a computer runs an engineering tool program. FIG. 3 is a diagram illustrating a hardware configuration of the computer that runs the engineering tool program in the programmable logic controller system according to the first embodiment. A computer 50 includes a calculator 51, which performs calculation processing; a memory 52, which is used as a work area by the calculator 51; a storage 53, which stores an engineering tool program 60 and information; an input unit 54, which is an input interface; a display 55, which displays information; and a communication unit 56, which is used to communicate with the programmable logic controller 10.

Figure 4:
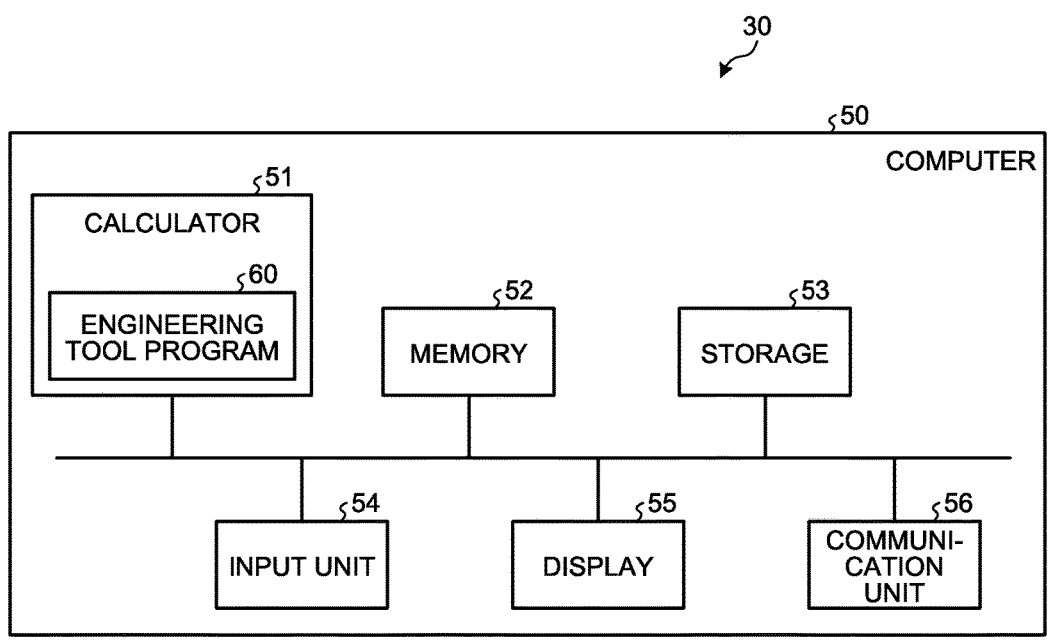
FIG. 4 is a diagram illustrating the computer with the engineering tool program running therein in the programmable logic controller system according to the first embodiment.

FIG. 4 is a diagram illustrating the computer with the engineering tool program running therein in the programmable logic controller system according to the first embodiment. The engineering tool 30 is implemented by the calculator 51 of the computer 50 executing the engineering tool program 60 while using the memory 52 as the work area. In other words, the input data generation unit 32, the output data storage unit 33, the debugging period instruction unit 34, the display unit 35, and the control unit 36 illustrated in FIG. 2 are implemented when the calculator 51 executes the engineering tool program 60. The above functions may also be implemented by a plurality of calculators and a plurality of memories cooperating with each other.

Figure 5:
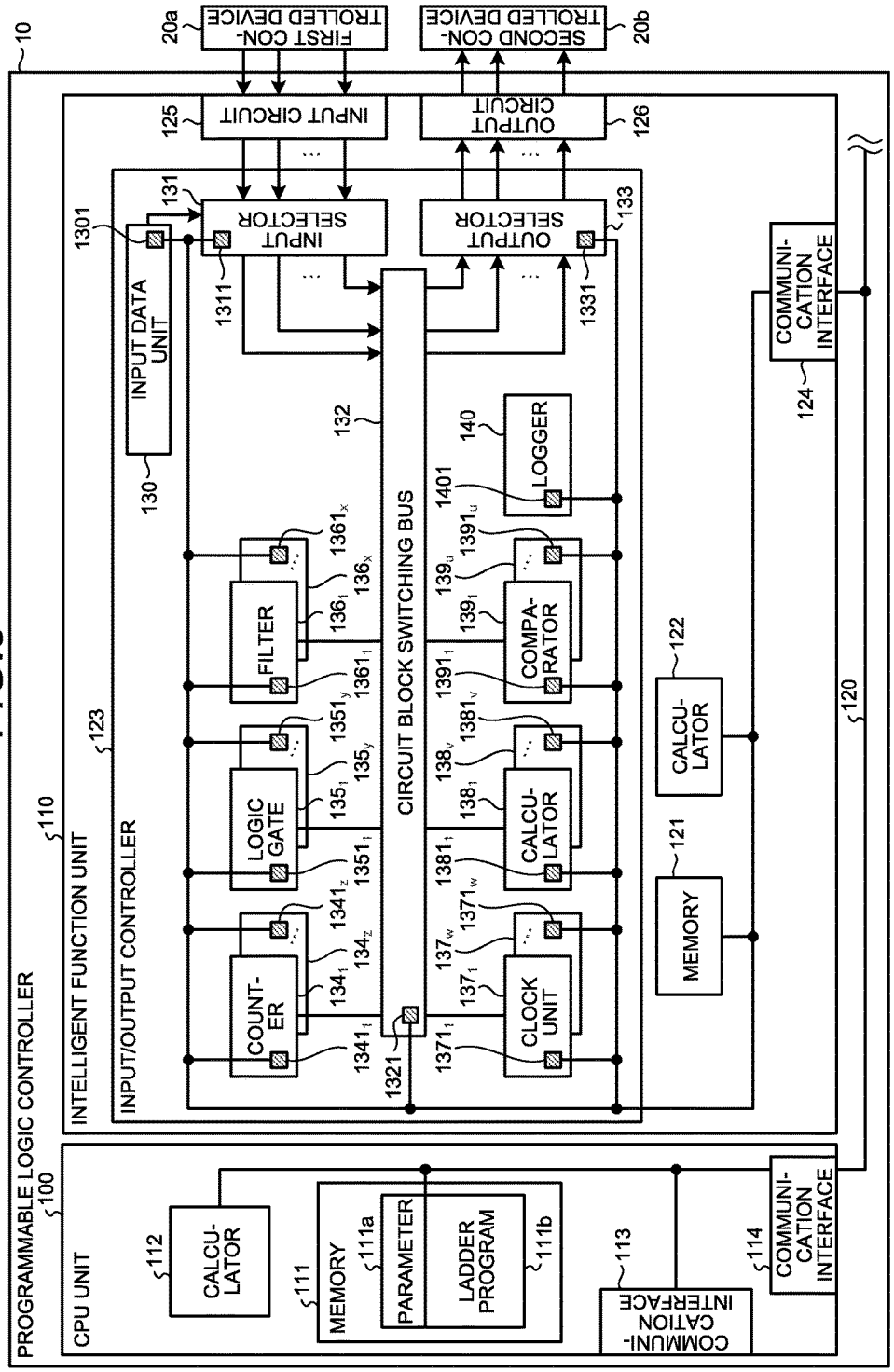
FIG. 5 is a diagram illustrating the configuration of a programmable logic controller in the programmable logic controller system according to the first embodiment.

FIG. 5 is a diagram illustrating the configuration of the programmable logic controller in the programmable logic controller system according to the first embodiment. The programmable logic controller 10 includes a central processing unit (CPU) 100, which is an operation processing unit (operation processor) that executes a ladder program in accordance with the preset parameter; an intelligent function unit 110, which changes the operation in accordance with the parameter and the ladder program to control the first controlled device 20a and the second controlled device 20b; and a communication bus 120, which connects the CPU unit and the intelligent function unit.

The CPU unit 100 includes a memory 111, which stores a parameter 111a and a ladder program 111b; a calculator 112, which executes the ladder program 111b stored in the memory 111; a communication interface 113, which is used to communicate with the engineering tool 30; and a communication interface 114, which is used in communication via the communication bus 120.

The intelligent function unit 110 includes a memory 121, which stores information indicating in which order a plurality of general circuit blocks (to be described) are operated; a calculator 122, which causes an input/output controller (input/output control unit) 123 to perform a debug operation; the input/output controller 123, which is a reconfigurable circuit that includes the general circuit blocks; a communication interface 124, which is used in communication via the communication bus 120; an input circuit 125, which receives an actual input signal from the first controlled device 20a; and an output circuit 126, which outputs an output signal to the second controlled device 20b. In the first embodiment, the first controlled device 20a is a sensor and the second controlled device 20b is a switch. Note that the first controlled device 20a and the second controlled device 20b may be the same device.

The input/output controller 123 includes an input data unit 130, which stores a simulated input signal used in debugging; an input selector 131, which enables or disables the input circuit 125 during the debug operation to select either the actual input signal or the simulated input signal as the input signal; a circuit block switching bus 132, which can modify the combination and the order of use of the general circuit blocks; and an output selector 133, which selects whether to transmit an output signal that is a debugging result to the second controlled device 20b. The output selector 133 disables the output circuit 126 during the debug operation so that the debugging result is not output to the second controlled device 20b.

The general circuit blocks included in the input/output controller 123 are a plurality of counters $134_1$ to $134_z$, which count numerical values; a plurality of logic gates $135_1$ to $135_y$, which perform basic logic operations; a plurality of filters $136_1$ to $136_x$, which remove noise from the input signal; a plurality of clock units $137_1$ to $137_w$, which supply a clock to the general circuit blocks in the input/output controller 123 to operate the general circuit blocks; a plurality of calculators $138_1$ to $138_v$, which perform preset calculation processing; and a plurality of comparators $139_1$ to $139_u$, which perform comparison processing. The input/output controller 123 includes a logger 140, which stores the output signal that is the debugging result for each step. Note that the basic logic operations include logical NOT, AND, OR, XOR, NOR, and NAND operations.

The input data unit 130 includes a register 1301, which stores setting. The input selector 131 includes a register 1311, which stores setting. The circuit block switching bus 132 includes a register 1321, which stores setting. The output selector 133 includes a register 1331, which stores setting. The counters $134_1$ to $134_z$ respectively include registers $1341_1$ to $1341_z$, which store setting. The logic gates $135_1$ to $135_y$ respectively include registers $1351_1$ to $1351_y$, which store setting. The filters $136_1$ to $136_x$ respectively include registers $1361_1$ to $1361_x$, which store setting. The clock units $137_1$ to $137_w$ respectively include registers $1371_1$ to $1371_w$, which store setting. The calculators $138_1$ to $138_v$ respectively include registers $1381_1$ to $1381_v$, which store setting. The comparators $139_1$ to $139_u$ respectively include registers $1391_1$ to $1391_u$, which store setting. The logger 140 includes a register 1401, which stores setting.

The calculator 122 causes the input/output controller 123 to process an input signal for each step and transmits an output signal to the engineering tool 30. Alternatively, the calculator 122 causes the input/output controller 123 to process the input signal consecutively for a set period corresponding to two or more steps, stores an output signal for each step in the logger 140, and transmits the output signal corresponding to the set period and stored in the logger 140 to the engineering tool 30. In the debug operation, the calculator 122 transmits an instruction to the clock units $137_1$ to $137_w$, which output a divided clock to the general circuit blocks.

The intelligent function unit 110 includes the input/output controller 123, which is reconfigurable by modifying the combination and the order of use of the general circuit blocks, and the intelligent function unit 110 causes the general circuit blocks to process an input signal and outputs an output signal that is the debugging result.

In the normal mode not involving debugging, the calculator 112 executes the ladder program 111b on the basis of the parameter 111a stored in the memory 111, and sends an instruction to the calculator 122 via the communication bus 120. According to the instruction from the calculator 112, the calculator 122 determines the combination and the order of use of the general circuit blocks to store the setting in the registers 1301, 1311, 1321, 1331, $1341_1$ to $1341_z$, $1351_1$ to $1351_y$, $1361_1$ to $1361_x$, $1371_1$ to $1371_w$, $1381_1$ to $1381_v$, and $1391_1$ to $1391_u$. The register 1311 of the input selector 131 stores the setting that enables the input circuit 125. The register 1331 of the output selector 133 stores the setting that enables the output circuit 126. An actual input signal input from the first controlled device 20a is then processed by the input/output controller 123, and an output signal is output from the output circuit 126 to the second controlled device 20b.

Figure 6:
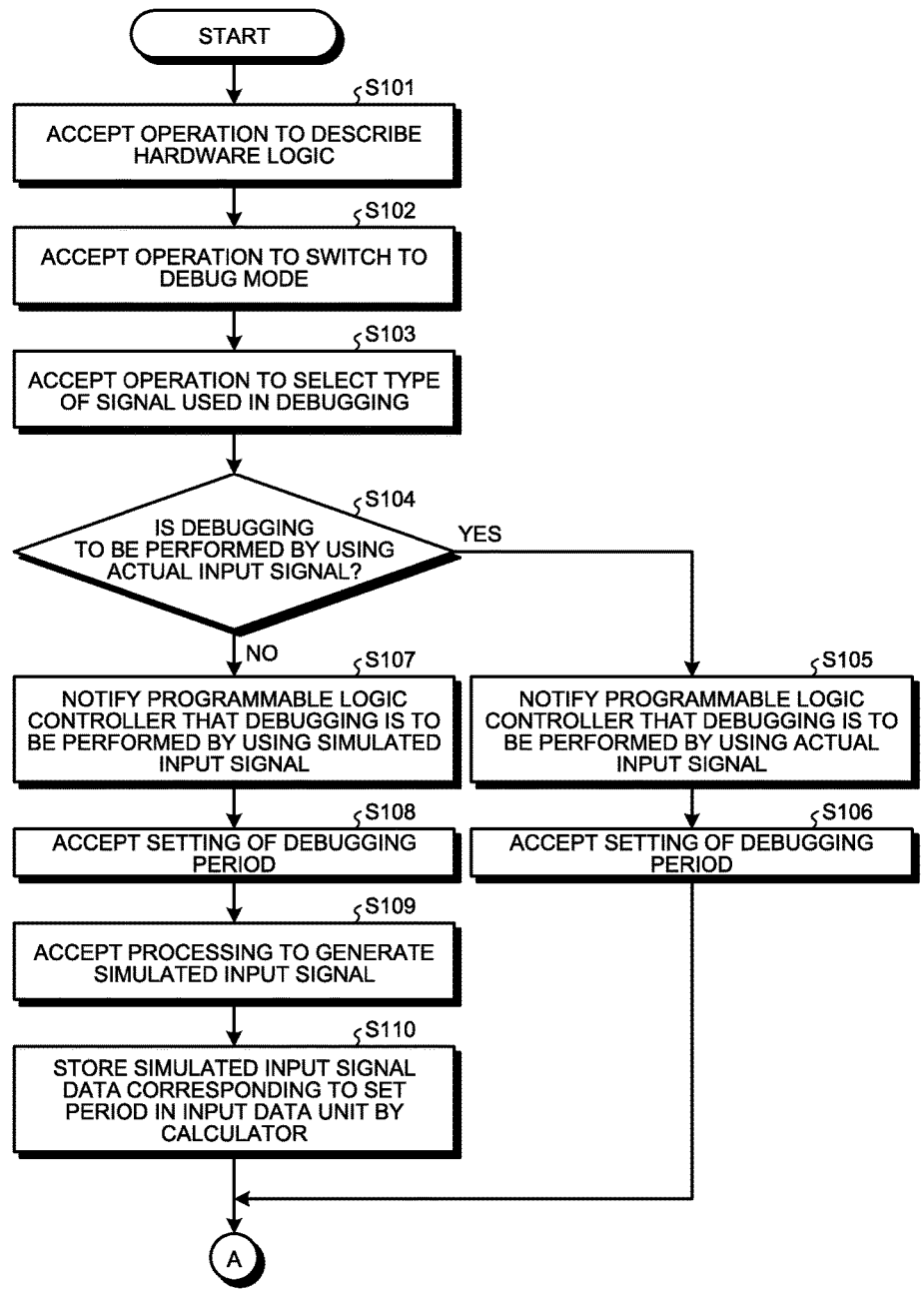
FIG. 6 is a flowchart illustrating the flow of a debug operation of the programmable logic controller system according to the first embodiment.
Figure 7:
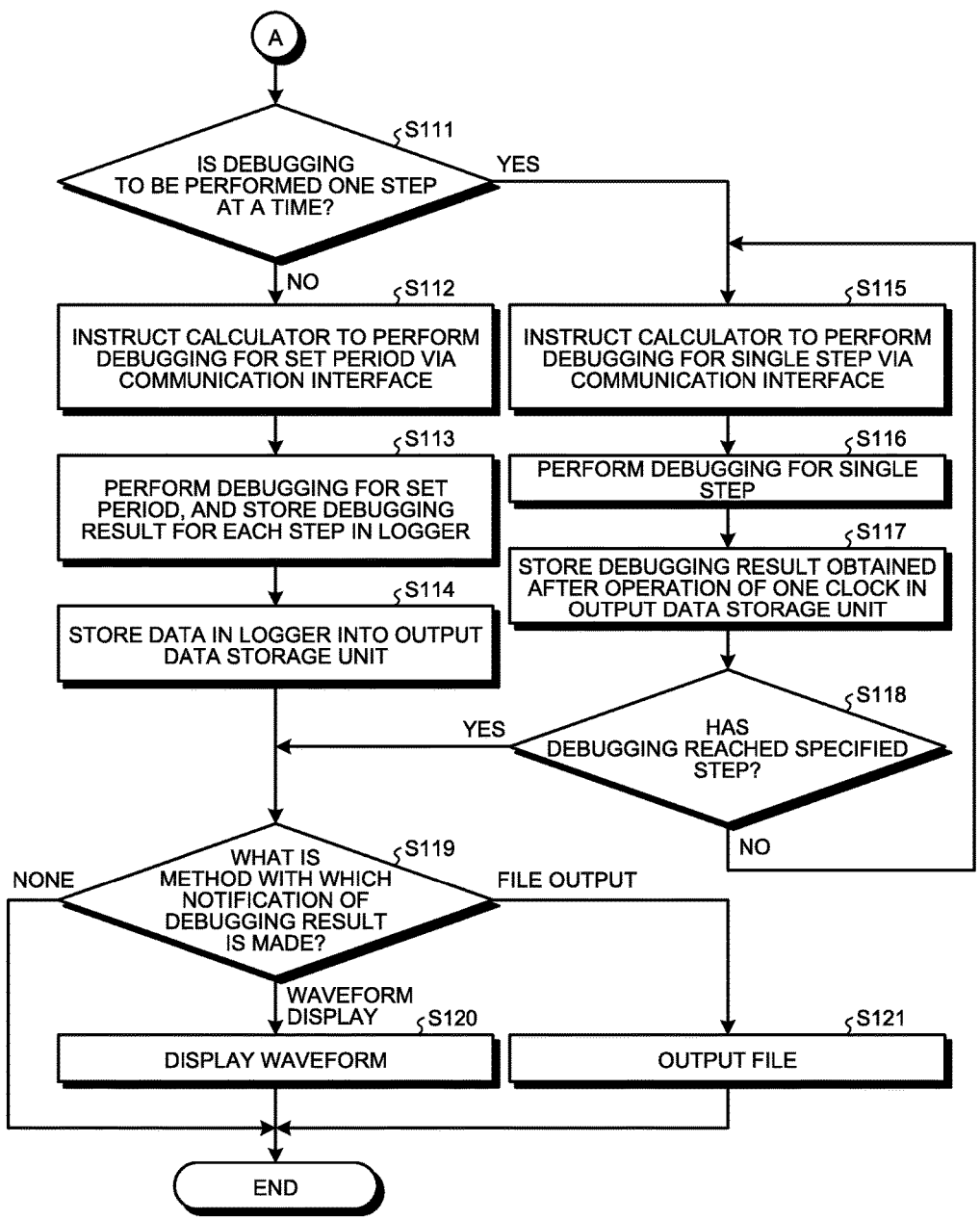
FIG. 7 is a flowchart illustrating the flow of the debug operation of the programmable logic controller system according to the first embodiment.
Figure 8:
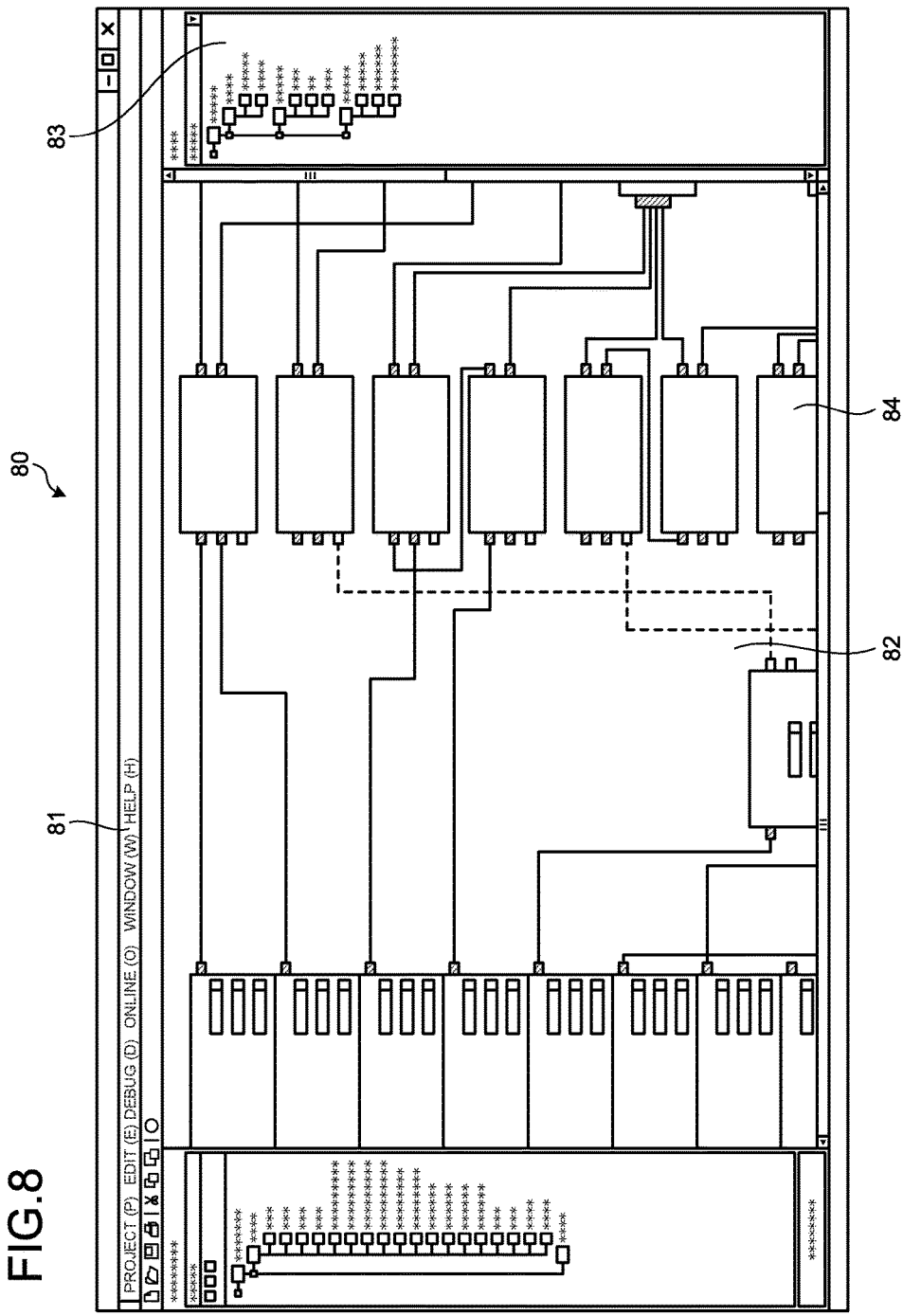
FIG. 8 is a diagram illustrating an example of an engineering tool screen that is displayed on a display by a display unit of the engineering tool in the programmable logic controller system, according to the first embodiment.

An operation performed during the debug operation by the engineering tool of the programmable logic controller system according to the first embodiment will be described. FIGS. 6 and 7 are flowcharts illustrating the flow of the debug operation of the programmable logic controller system according to the first embodiment. FIG. 8 is a diagram illustrating an example of an engineering tool screen that is displayed on the display by the display unit of the engineering tool in the programmable logic controller system according to the first embodiment. An engineering tool screen 80 includes a menu bar 81, which displays a menu; a work window 82, which displays a hardware logic 84 to be debugged, and a component selection window 83, which displays components that make up the hardware logic 84. Specific examples of the components that make up the hardware logic 84 include a parallel encoder block, a multifunction counter block, a logic operation block, and a function block.

In step S101, the control unit 36 of the engineering tool 30 accepts an operation to describe the hardware logic 84 in the work window 82 of the engineering tool screen 80. The description of the hardware logic 84 is performed by the user selecting a component in the component selection window 83 and placing the component in the work window 82 with the input unit 54.

Figure 9:
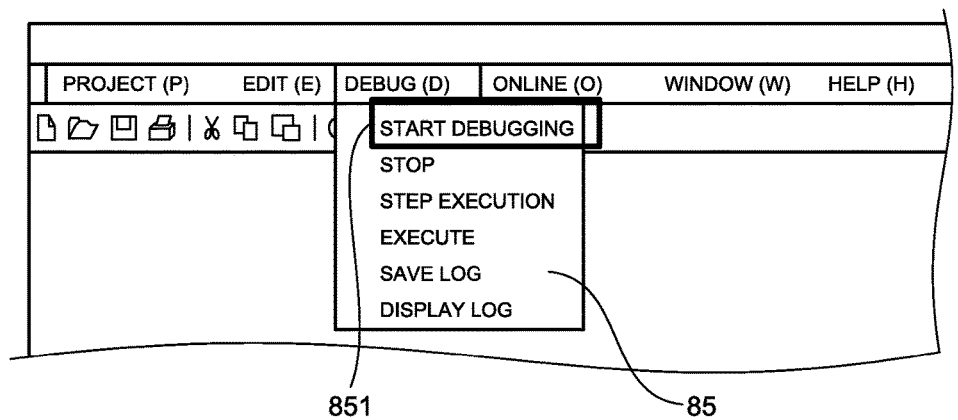
FIG. 9 is a diagram illustrating an example of the engineering tool screen displaying a pull-down menu that includes a menu item to switch from a normal mode to a debug mode, according to the programmable logic controller system of the first embodiment.

In step S102, the control unit 36 accepts an operation to switch to the debug mode. When the user operates the input unit 54 to select "debug" from the menu bar 81 in the engineering tool screen 80, the display unit 35 displays, in the engineering tool screen 80, a pull-down menu used to perform switching between the normal mode and the debug mode. In the normal mode, the display unit 35 displays, in the engineering tool screen 80, a pull-down menu that includes a menu item to shift to the debug mode. FIG. 9 is a diagram illustrating an example of the engineering tool screen displaying the pull-down menu that includes the menu item to switch from the normal mode to the debug mode, according to the programmable logic controller system of the first embodiment. The control unit 36 accepts an operation to select a mode switching menu item 851 in a pull-down menu 85.

Figure 10:
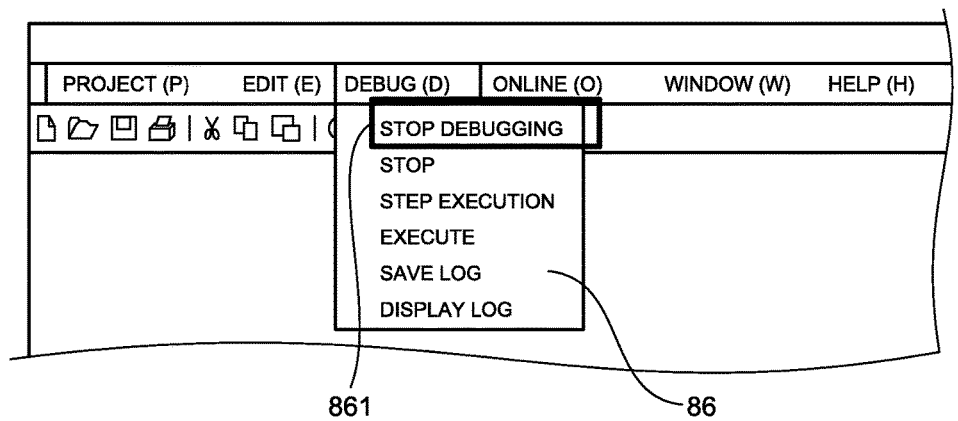
FIG. 10 is a diagram illustrating an example of the engineering tool screen displaying a pull-down menu that includes a menu item to switch from a debug mode to a normal mode, according to the programmable logic controller system of the first embodiment.

Note that in the debug mode, the display unit 35 displays, in the engineering tool screen 80, a pull-down menu that includes a menu item to shift to the normal mode. FIG. 10 is a diagram illustrating an example of the engineering tool screen displaying the pull-down menu that includes the menu item to switch from the debug mode to the normal mode, according to the programmable logic controller system of the first embodiment. A pull-down menu 86 displayed in the engineering tool screen 80 includes a menu item 861 to shift from the debug mode to the normal mode.

Figure 11:
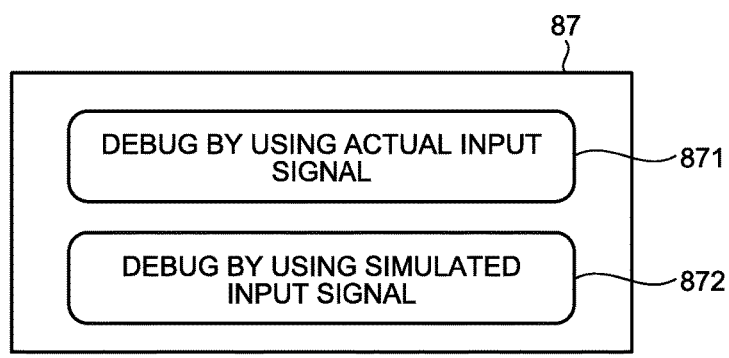
FIG. 11 is a diagram illustrating an example of a selection dialog used to select whether to perform debugging by using an actual input signal or by using a simulated input signal, according to the programmable logic controller system of the first embodiment.

When the user operates the input unit 54 and selects the menu item to shift to the debug mode, the control unit 36 in step S103 accepts an operation to select the type of a signal used in debugging. Specifically, the display unit 35 displays, in the engineering tool screen 80, a selection dialog used to select whether to perform debugging by using the actual input signal or by using the simulated input signal. FIG. 11 is a diagram illustrating an example of the selection dialog used to select whether to perform debugging by using the actual input signal or by using the simulated input signal, according to the programmable logic controller system of the first embodiment. A selection dialog 87 includes an actual input signal selection button 871 and a simulated input signal selection button 872. When the user presses the actual input signal selection button 871, the control unit 36 determines that the user makes a selection to perform debugging by using the actual input signal. When the user presses the simulated input signal selection button 872, the control unit 36 determines that the user makes a selection to perform debugging by using the simulated input signal.

When the user operates the input unit 54 to select debugging using the actual input signal, Yes is determined in step S104. In step S105, the control unit 36 notifies the programmable logic controller 10 that the hardware logic 84 described in the work window 82 is to be debugged by using the actual input signal. The calculator 122 of the intelligent function unit 110 then refers to information stored in the memory 121, determines the combination and the order of use of the general circuit blocks used to process the hardware logic 84, and stores the setting in the registers 1301, 1311, 1321, 1331, 1341$_1$ to 1341$_z$, 1351$_1$ to 1351$_y$, 1361$_1$ to 1361$_x$, 1371$_1$ to 1371$_w$, 1381$_1$ to 1381$_v$, and 1391$_1$ to 1391$_u$. The register 1311 of the input selector 131 stores the setting that enables the input circuit 125. The register 1331 of the output selector 133 stores the setting that disables the output circuit 126.

Figure 12:
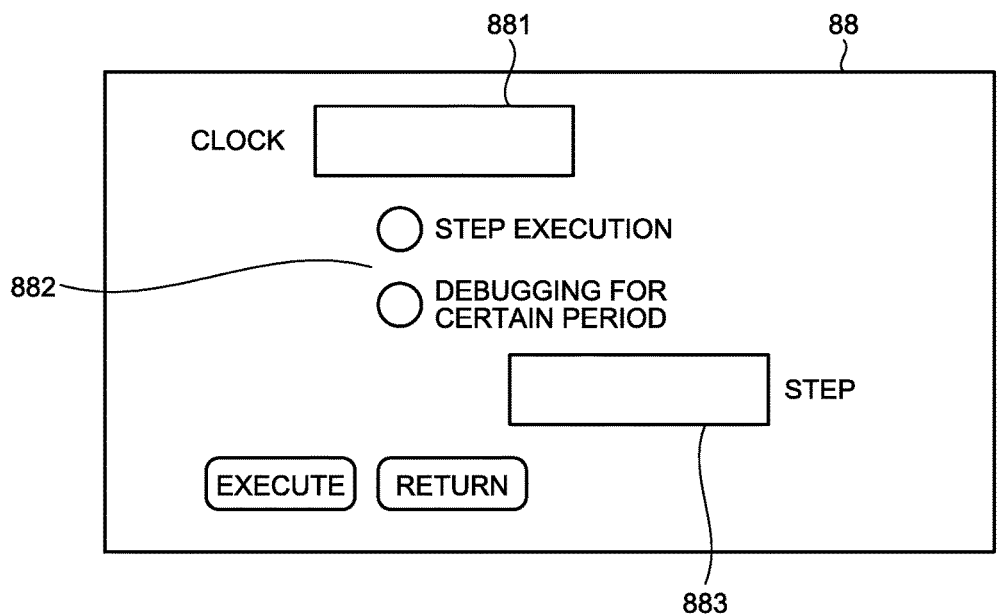
FIG. 12 is a diagram illustrating an example of a period setting dialog in the programmable logic controller system according to the first embodiment.

In step S106, the debugging period instruction unit 34 accepts setting of the debugging period. Specifically, the debugging period instruction unit 34 displays, on the engineering tool screen 80, a period setting dialog used to specify a clock at which debugging starts, select whether to perform debugging one step at a time or for a certain period, and set the debugging period. FIG. 12 is a diagram illustrating an example of the period setting dialog in the programmable logic controller system according to the first embodiment. A period setting dialog 88 includes a starting step specification field 881, which specifies a step at which debugging starts; an operation type specification section 882, in which the user selects whether to perform debugging one step at a time or consecutively for a set period; and a period specification field 883, which specifies a period for which debugging is performed. The period setting dialog 88 is a graphical user interface of the debugging period instruction unit 34. The user can thus select whether to perform debugging one step at a time or consecutively for the set period in the graphical user interface environment. The operation type specification section 882 includes radio buttons that allow the user to select only one of the buttons corresponding to debugging performed one step at a time and debugging performed consecutively for the set period. The debugging period instruction unit 34 accepts an input operation performed on the period setting dialog 88.

When the user operates the input unit 54 to select debugging using the simulated input signal, No is determined in step S104. In step S107, the control unit 36 notifies the programmable logic controller 10 that the hardware logic 84 described in the work window 82 is to be debugged by using the simulated input signal. The calculator 122 of the intelligent function unit 110 then refers to the information stored in the memory 121, determines the combination and the order of use of the general circuit blocks used to process the hardware logic 84, and stores the setting in the registers 1301, 1311, 1321, 1331, 1341$_1$ to 1341$_z$, 1351$_1$ to 1351$_y$, 1361$_1$ to 1361$_x$, 1371$_1$ to 1371$_w$, 1381$_1$ to 1381$_v$, and 1391$_1$ to 1391$_u$. The register 1311 of the input selector 131 stores the setting that disables a signal from the input circuit 125 and enables a signal from the input data unit 130. The register 1331 of the output selector 133 stores the setting that disables the output circuit 126.

Figure 13:
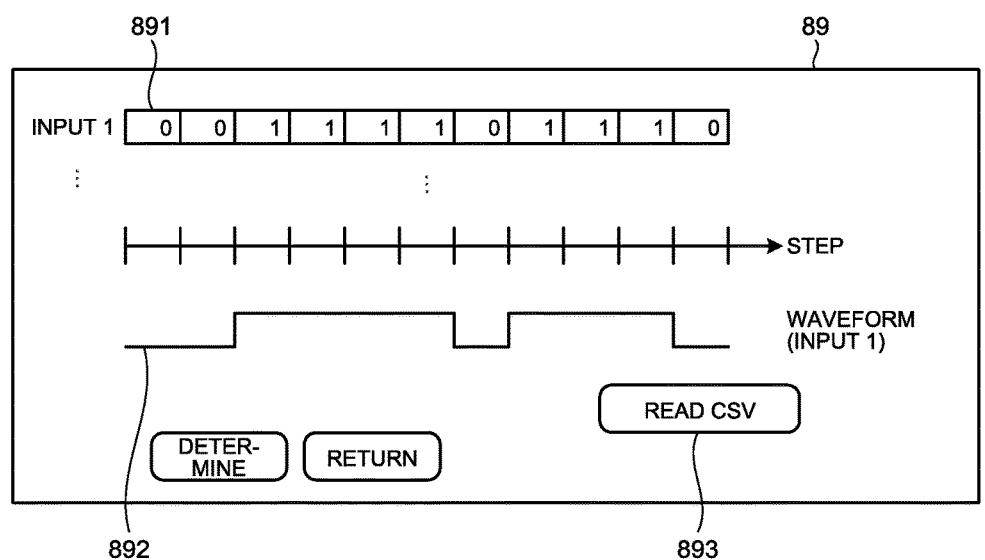
FIG. 13 is a diagram illustrating an example of a simulated input signal setting dialog according to the programmable logic controller system of the first embodiment.

In step S108, the debugging period instruction unit 34 accepts setting of the debugging period as with step S106. After step S108, the input data generation unit 32 accepts processing to generate the simulated input signal in step S109. Specifically, the input data generation unit 32 displays a simulated input signal setting dialog on the engineering tool screen 80. FIG. 13 is a diagram illustrating an example of the simulated input signal setting dialog according to the programmable logic controller system of the first embodiment. A simulated input signal setting dialog 89 includes a value input field 891, to which a value of 0 or 1 is input for each step, and a waveform display section 892, which displays a waveform obtained by converting the value input to the value input field 891. The simulated input signal is generated by specifying a low or high level with the value of 0 or 1 for each step in the value input field 891. The number of simulated input signals generated corresponds to the number of channels used in debugging. The simulated input signal setting dialog 89 is a graphical user interface of the input data generation unit 32. The user can thus generate the simulated input signals in the graphical user interface environment.

The simulated input signal setting dialog 89 includes a file read button 893. When the file read button 893 is pressed, a string of 0s and 1s in a file having a comma-separated text format is read from the storage 53, so that the value of 0 or 1 is input to the value input field 891 for each step.

The input data generation unit 32 converts the simulated input signal, the level of which is set to 0 or 1 for each step, into a waveform and displays the waveform in the waveform display section 892. Displaying the waveform of the simulated input signal in the waveform display section 892 allows the user to visually recognize an error in the specification of the level, i.e., high or low, of the simulated input signal for each step, thereby reducing an error in the setting of the simulated input signal.

Steps S108 and S109 may be executed in reverse order. That is, the setting of the debugging period may be accepted after the processing to generate the simulated input signal is accepted.

In step S110, the control unit 36 transmits data of the simulated input signals corresponding to the set period to the programmable logic controller 10. The calculator 122 of the intelligent function unit 110 stores the data of the simulated input signals in the input data unit 130.

After completion of the processing in step S106 or S110, the control unit 36 in step S111 checks whether the setting is such that debugging is to be performed consecutively for the set period or is such that debugging is to be performed one step at a time. When debugging is to be performed consecutively for the set period, No is determined in step S111. In this case, the control unit 36 proceeds to step S112 and instructs the calculator 122 to perform debugging for the set period via the communication interface. The register 1401 of the logger 140 stores setting that enables the logger 140.

In step S113, the calculator 122 performs debugging for the set period and stores the debugging result for each step in the logger 140. Specifically, the calculator 122 causes the clock units 137$_1$ to 137$_w$ to supply clocks for the set period to the other general circuit blocks to operate the other general circuit blocks consecutively for the set period.

After completion of debugging for the set period, the calculator 122 in step S114 reads the data from the logger 140, transmits it to the engineering tool 30, and stores it in the output data storage unit 33.

When debugging is to be performed one step at a time, Yes is determined in step S111. In this case, the control unit 36 proceeds to step S115 and instructs the calculator 122 to perform debugging for a single step via the communication interface. The register 1401 of the logger 140 stores setting that disables the logger 140.

The calculator 122 thus causes the input/output controller 123 in which the combination and the order of use of the general circuit blocks are set to process the input signal one step at a time or consecutively for the set period of two or more steps.

In step S116, the calculator 122 performs debugging for a single step. Specifically, the calculator 122 supplies one clock from the clock units 137$_1$ to 137$_w$ to the other general circuit blocks to operate the other general circuit blocks. In step S117, the calculator 122 transmits the debugging result to the engineering tool 30 via the communication interface and stores the result in the output data storage unit 33.

After step S117, the control unit 36 determines whether debugging has been performed up to the step set in step S106 or S108. That is, the calculator 122 determines whether debugging has reached the specified step. If debugging has been performed up to the step set in step S106 or S108, Yes is determined in step S118 and the processing proceeds to step S119. If debugging has not been performed up to the step set in step S106 or S108, No is determined in step S118 and the processing proceeds to step S115.

Figure 14:
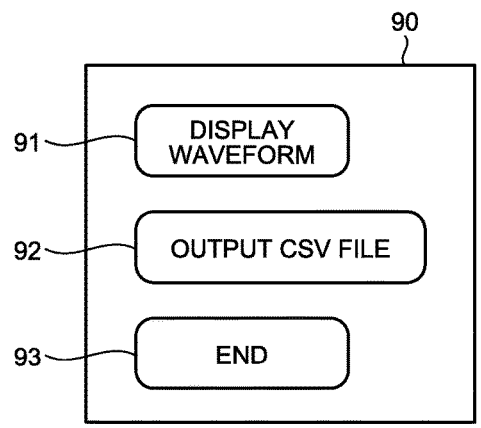
FIG. 14 is a diagram illustrating an example of an inquiry screen asking about a method with which notification of a debugging result is made, according to the programmable logic controller system of the first embodiment.

After step S114 or if Yes is determined in step S118, the control unit 36 inquires of the user about the method with which notification of the debugging result is made in step S119. Specifically, the display unit 35 displays, on the display 55, an inquiry screen asking whether the debugging result is displayed as a waveform or is output as a file in a comma-separated text format. FIG. 14 is a diagram illustrating an example of the inquiry screen asking about the method with which notification of the debugging result is made, according to the programmable logic controller system of the first embodiment. An inquiry screen 90 asking about the method with which notification of the debugging result is made includes a waveform display selection button 91, a file output selection button 92, and an end button 93.

Figure 15:
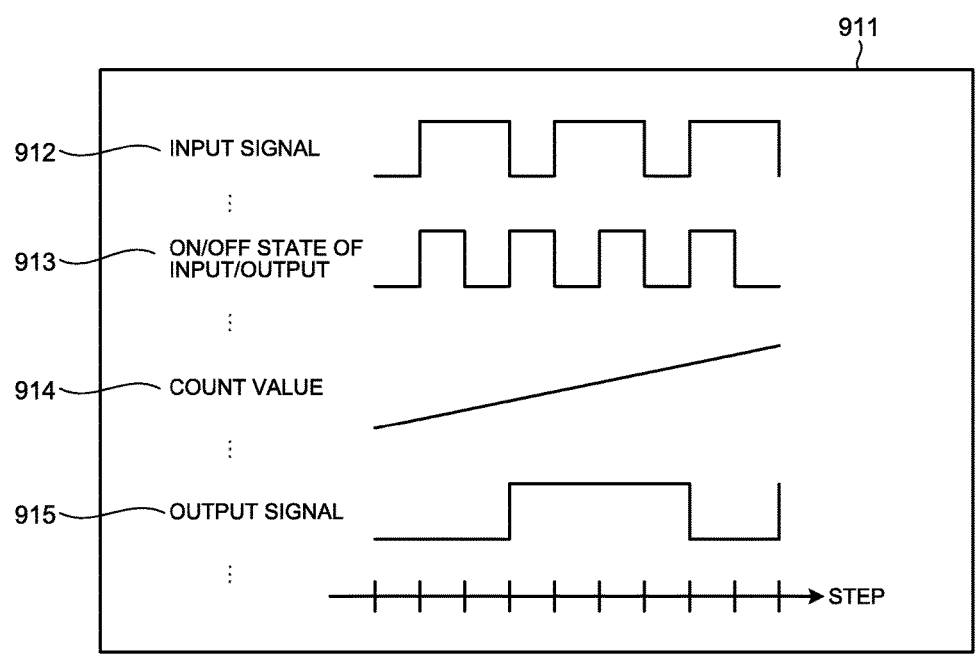
FIG. 15 is a diagram illustrating an example of a debugging result display screen according to the programmable logic controller system of the first embodiment.

When the user operates the input unit 54 to press the waveform display selection button 91, "waveform display" is selected in step S119. In step S120, the display unit 35 displays the debugging result on the engineering tool screen 80. FIG. 15 is a diagram illustrating an example of a debugging result display screen according to the programmable logic controller system of the first embodiment. A debugging result display screen 911 displays a waveform 912 of the input signal corresponding to the specified number of steps, an on/off state 913 of the input/output controller 123, a count value 914 of the input/output controller 123, and a waveform 915 of the output signal.

When the file output selection button 92 is pressed, "file output" is selected in step S119. In step S121, the control unit 36 stores the debugging result in the storage 53.

When the end button 93 is pressed, "none" is selected in step S119, thereby ending the debugging processing.

Note that the simulated input signal generated by operating the engineering tool 30 in the aforementioned description may instead be generated by operating the intelligent function unit 110 and stored in the input data unit 130.

Although the intelligent function unit 110 in the aforementioned description is connected to the engineering tool 30 via the CPU unit 100 and transmits the debugging result to the engineering tool 30 via the CPU unit 100, the intelligent function unit 110 may instead be connected to the engineering tool 30 via a network and transmit the debugging result to the engineering tool 30 via the network.

Figure 16:
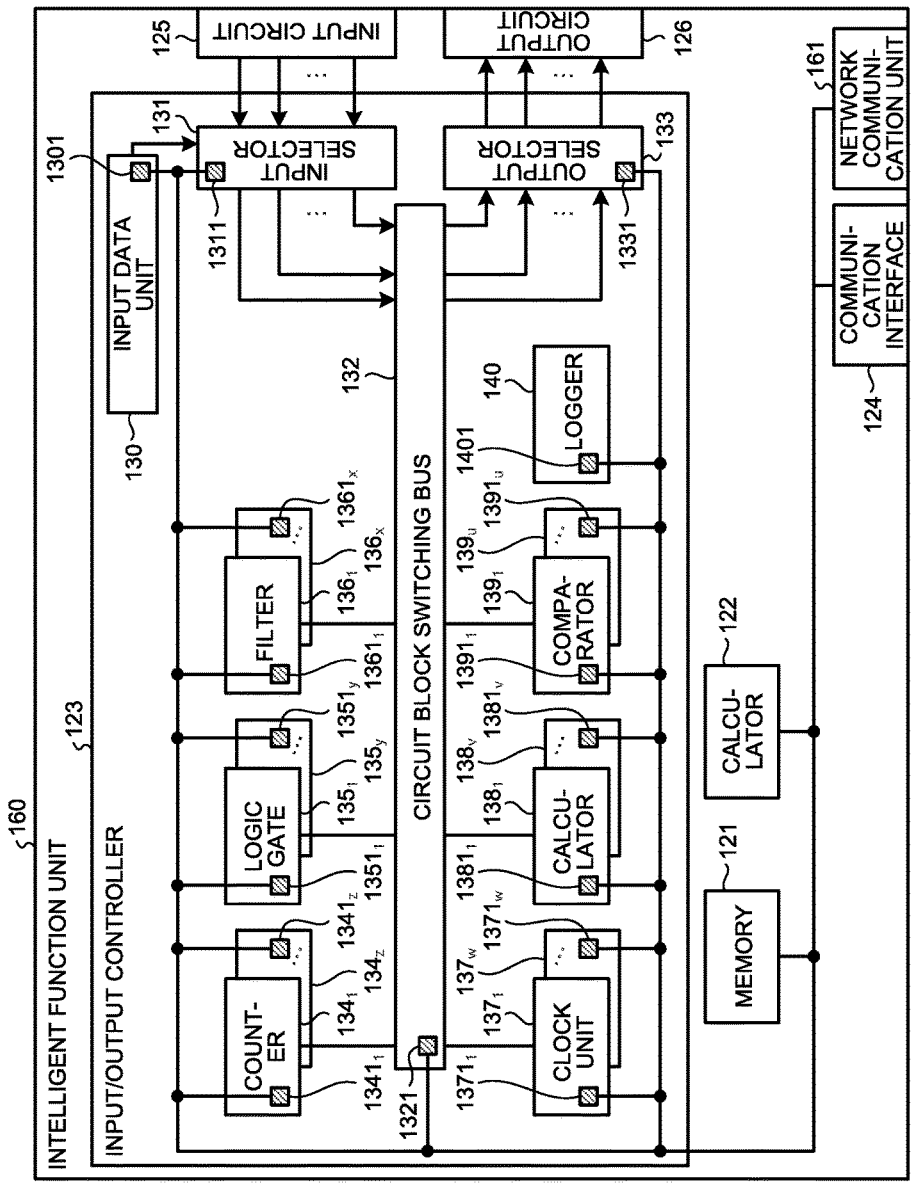
FIG. 16 is a diagram illustrating a modification of the intelligent function unit in the programmable logic controller system according to the first embodiment.

FIG. 16 is a diagram illustrating a modification of the intelligent function unit in the programmable logic controller system according to the first embodiment. An intelligent function unit 160 is different from the intelligent function unit 110 in that the intelligent function unit 160 includes a network communication unit 161. The network communication unit 161 is a communication interface used to communicate with the engineering tool 30 via the network. The intelligent function unit 160 can use the network communication unit 161 to transmit the debugging result to the engineering tool 30 via the network.

Compared to the intelligent function unit 160 of the modification, the intelligent function unit 110 does not require the network communication unit 161; therefore, the intelligent function unit 110 prevents an increase in the circuit scale more effectively.

The intelligent function unit 110 of the programmable logic controller system 40 according to the first embodiment includes the input data unit 130; the input selector 131; the output selector 133; and the logger 140 as the components that are included in the input/output controller 123 and that are used for implementing the debug function, whereby a component need not be added to each general circuit block. This can prevent an increase in the circuit scale. Moreover, the calculator 122 transmits the debugging result to the engineering tool 30 when performing debugging one step at a time. When performing debugging consecutively for the set period, the calculator 122 stores the debugging result for each step in the logger 140. Then after completing debugging for the set period, the calculator 122 transmits the debugging results corresponding to the set period and stored in the logger 140 to the engineering tool 30. The debugging result of the intelligent function unit 110 can thus be displayed in the debugging result display screen 911 of the engineering tool 30.

When debugging is performed consecutively for the set period, the control unit 36 of the programmable logic controller system 40 according to the first embodiment need not instruct the calculator 122 to perform debugging every time it is to be performed, whereby the load of the calculator 51 can be reduced.

In the debug operation, the calculator 122 gives an instruction to supply the divided clocks from the clock units 137$_1$ to 137$_w$ to operate the other general circuit blocks, so that the general circuit blocks in the input/output controller 123 operating at a higher speed than the calculator 122 in the normal mode can be operated at the operating cycle of the calculator 122 to allow for debugging and checking of the debugging result.

The programmable logic controller system 40 according to the first embodiment implements the general circuit blocks as hardware in the input/output controller 123 and changes the operating mode of each of the general circuit blocks according to the register setting of the intelligent function unit 110. The general circuit blocks can be selectively combined as well. This allows the intelligent function unit 110 of the programmable logic controller 10 performing various input/output controls to implement the debug function to verify the operation of each general circuit block and the operation of the combination of the general circuit blocks.

Second Embodiment

Figure 17:
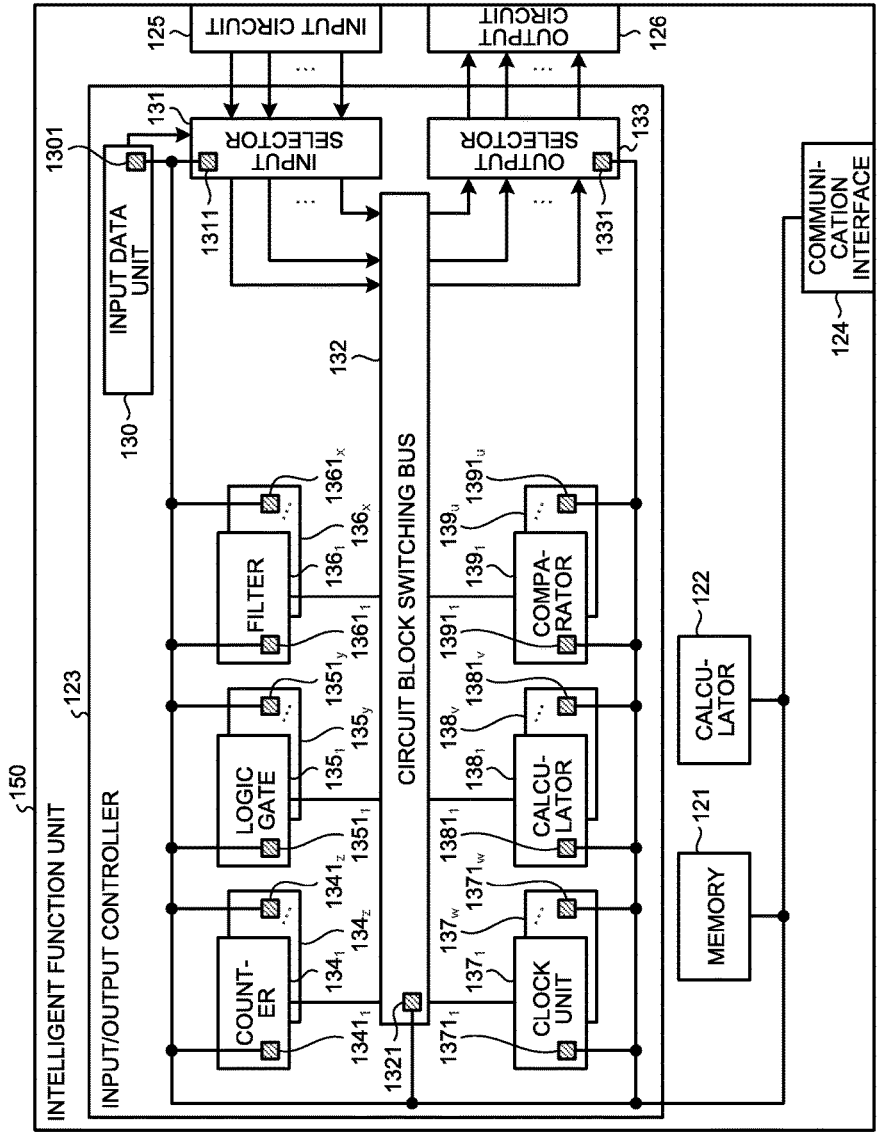
FIG. 17 is a diagram illustrating the configuration of an intelligent function unit according to a second embodiment of the present invention.

FIG. 17 is a diagram illustrating the configuration of an intelligent function unit according to a second embodiment of the present invention. An intelligent function unit 150 according to the second embodiment does not include the logger 140 included in the intelligent function unit 110 of the first embodiment. Except for the absence of the logger 140, the intelligent function unit 150 is similar to the intelligent function unit 110 of the first embodiment.

Figure 18:
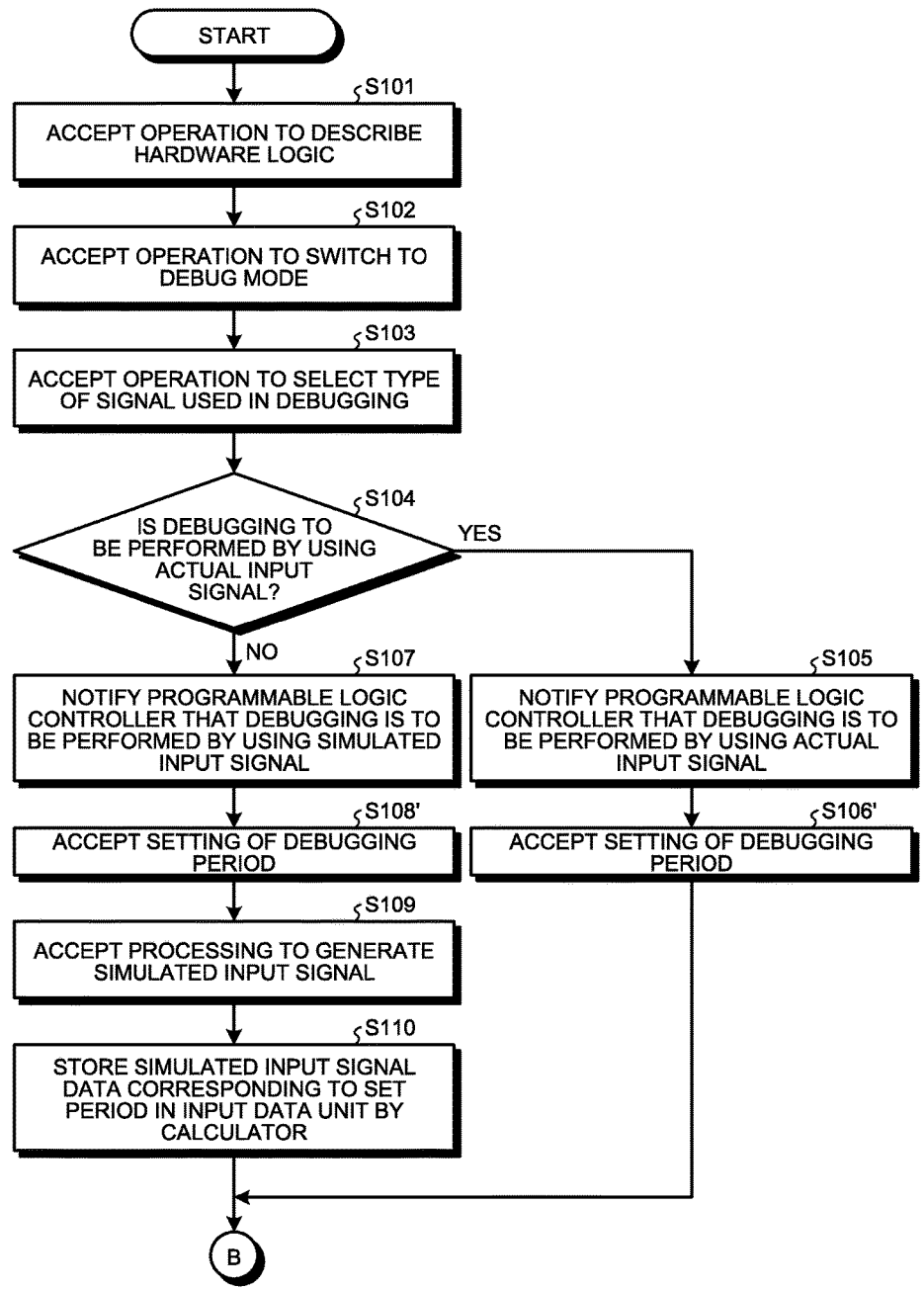
FIG. 18 is a flowchart illustrating the flow of a debug operation of a programmable logic controller system that includes a programmable logic controller equipped with the intelligent function unit, according to the second embodiment.
Figure 19:
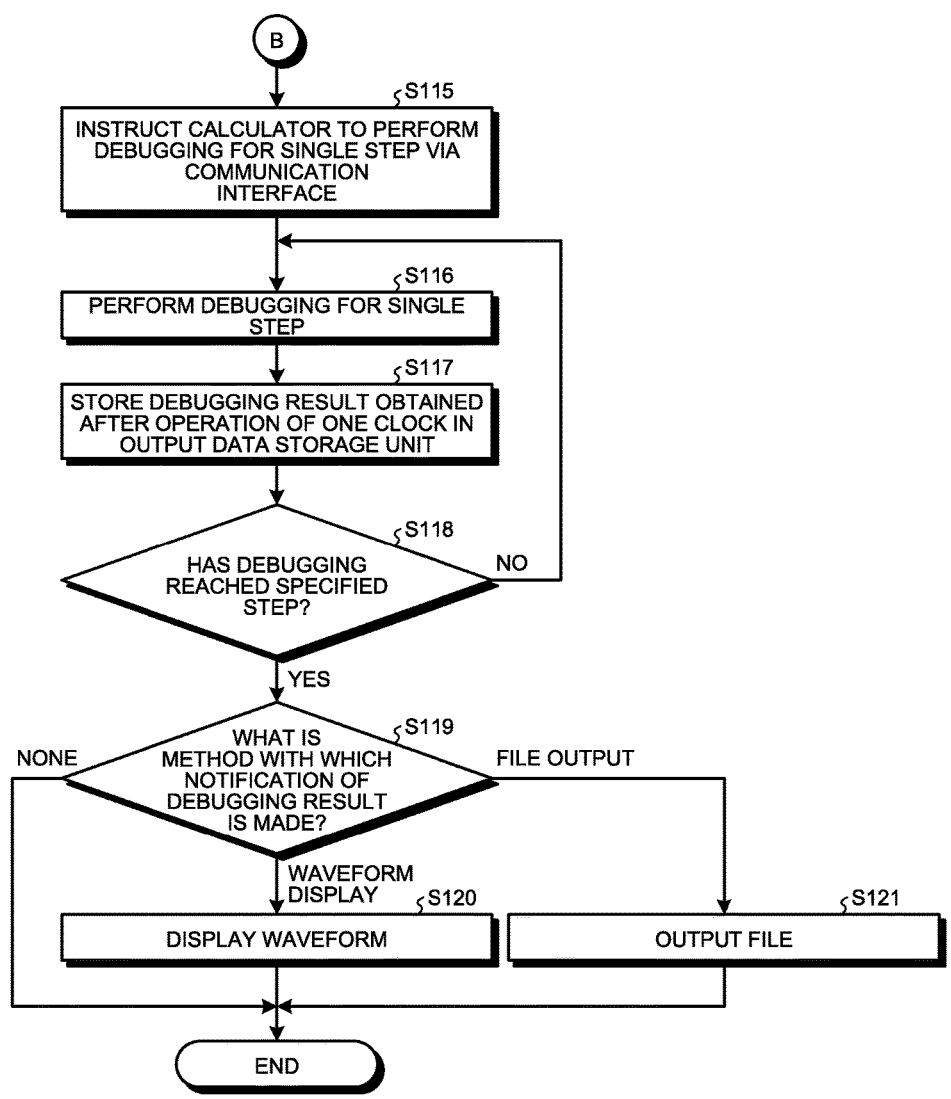
FIG. 19 is a flowchart illustrating the flow of the debug operation of the programmable logic controller system that includes the programmable logic controller equipped with the intelligent function unit, according to the second embodiment.

FIGS. 18 and 19 are flowcharts illustrating the flow of a debug operation of a programmable logic controller system that includes a programmable logic controller equipped with the intelligent function unit, according to the second embodiment. The debug operation of the second embodiment differs from that of the programmable logic controller system 40 of the first embodiment in that steps S106 and S108 are changed to steps S106' and S108' and that steps S111 to S114 are not included. The rest is the same as the debug operation of the programmable logic controller system 40 according to the first embodiment.

In steps S106' and S108', a debugging period instruction unit 34 accepts setting of a debugging period. Specifically, the debugging period instruction unit 34 displays, on an engineering tool screen, a period setting dialog used to specify a clock at which debugging starts and set the debugging period. That is, the debug operation of the second embodiment differs from the debug operation of the programmable logic controller system 40 according to the first embodiment in that steps S106' and S108' do not involve selection of whether to perform debugging one step at a time or consecutively for a set period.

After that, the debug operation of the second embodiment does not perform processing corresponding to steps S111 to S114 in the debug operation of the programmable logic controller system 40 according to the first embodiment. The debug operation is thus performed one step at a time even though the selection of whether to perform debugging one step at a time or consecutively for the set period is not made in step S106' or S108'.

The intelligent function unit 150 according to the second embodiment is limited to debugging performed one step at a time but does not require the logger; therefore, the configuration can be simplified and the cost can be reduced.

Note that the second embodiment may also be provided with a network communication unit that is a communication interface used to communicate with the engineering tool 30 via a network, as with the modification of the first embodiment.

The configurations illustrated in the aforementioned embodiments merely illustrate examples of the content of the preset invention, and can thus be combined with another known technique or partially omitted and/or modified without departing from the gist of the present invention.

REFERENCE SIGNS LIST 10 programmable logic controller, 20a first controlled device, 20b second controlled device, 30 engineering tool, 31 debug function unit, 32 input data generation unit, 33 output data storage unit, 34 debugging period instruction unit, 35 display unit, 36 control unit, 50 computer, 51 calculator, 52, 111, 121 memory, 53 storage, 54 input unit, 55 display, 56 communication unit, 60 engineering tool program, 80 engineering tool screen, 81 menu bar, 82 work window, 83 component selection window, 84 hardware logic, 85, 86 pull-down menu, 87 selection dialog, 88 period setting dialog, 89 simulated input signal setting dialog, 90 inquiry screen, 91 waveform display selection button, 92 file output selection button, 93 end button, 100 CPU unit, 110, 150, 160 intelligent function unit, 111a parameter, 111b ladder program, 112, 122 calculator, 113, 114, 124 communication interface, 120 communication bus, 123 input/output controller, 125 input circuit, 126 output circuit, 130 input data unit, 131 input selector, 132 circuit block switching bus, 133 output selector, $134_1$, $134_z$ counter, $135_1$, $135_y$ logic gate, $136_1$, $136_x$ filter, $137_1$, $137_w$ clock unit, $138_1$, $138_v$ calculator, $139_1$, $139_u$ comparator, 140 logger, 161 network communication unit, 851, 861 menu item, 871 actual input signal selection button, 872 simulated input signal selection button, 881 starting step specification field, 882 operation type specification section, 883 period specification field, 891 value input field, 892 waveform display section, 893 file read button, 911 debugging result display screen, 912 waveform of input signal, 913 on/off state, 914 count value, 915 waveform of output signal, 1301, 1311, 1321, 1331, $1341_1$, $1341_z$, $1351_1$, $1351_y$, $1361_1$, $1361_x$, $1371_1$, $1371_w$, $1381_1$, $1381_v$, $1391_1$, $1391_u$, 1401 register.

The invention claimed is:

1. An intelligent function unit that includes an input/output controller reconfigurable by changing a combination and an order of use of a plurality of general circuit blocks and that causes the input/output controller to process an actual input signal input from a first controlled device and outputs an output signal to a second controlled device, the intelligent function unit comprising:
an input selector to select, as an input signal, either the actual input signal or a simulated input signal generated in advance;
an output selector to select whether to output the output signal to the second controlled device; and
a calculator to cause the input/output controller in which the combination and the order of use of the general circuit blocks are set to process the input signal one step at a time and transmit the output signal to an external device or to cause the input/output controller in which the combination and the order of use of the general circuit blocks are set to process the input signal consecutively for a set period of two or more steps, store the output signal for each step in a logger, and transmit an output signal corresponding to the set period and stored in the logger to the external device.

2. The intelligent function unit according to claim 1, wherein the intelligent function unit is connected to the external device via an operation processor and transmits the output signal to the external device via the operation processor.

3. The intelligent function unit according to claim 1, wherein the intelligent function unit is connected to the external device via a network and transmits the output signal to the external device via the network.

4. An intelligent function unit that includes an input/output controller reconfigurable by changing a combination and an order of use of a plurality of general circuit blocks and that causes the input/output controller to process an actual input signal input from a first controlled device and outputs an output signal to a second controlled device, the intelligent function unit comprising:
an input selector to select, as an input signal, either the actual input signal or a simulated input signal generated in advance;
an output selector to select whether to output the output signal to the second controlled device; and
a calculator to cause the input/output controller in which the combination and the order of use of the general circuit blocks are set to process the input signal one step at a time and transmit the output signal to an external device.

5. The intelligent function unit according to claim 4, wherein the intelligent function unit is connected to the external device via an operation processor and transmits the output signal to the external device via the operation processor.

6. The intelligent function unit according to claim 4, wherein the intelligent function unit is connected to the external device via a network and transmits the output signal to the external device via the network.

7. A programmable logic controller system that includes:
a programmable logic controller that includes an intelligent function unit that includes an input/output controller reconfigurable by changing a combination and an order of use of a plurality of general circuit blocks and that causes the input/output controller to process an actual input signal input from a first controlled device and outputs an output signal to a second controlled device; and
an engineering tool equipped with a debug function of the programmable logic controller, wherein
the intelligent function unit includes:
an input selector to select, as an input signal, either the actual input signal or a simulated input signal generated in advance;
an output selector to select whether to output the output signal to the second controlled device; and
a calculator to cause the input/output controller in which the combination and the order of use of the general circuit blocks are set to process the input signal one step at a time and transmit the output signal to the engineering tool or to cause the input/output controller in which the combination and the order of use of the general circuit blocks are set to process the input signal consecutively for a set period of two or more steps, store the output signal for each step in a logger, and transmit an output signal corresponding to the set period and stored in the logger to the engineering tool, and
the engineering tool includes:
a processor to execute a program; and
a memory to store the program which, when executed by the processor, performs
an input data generation process of generating the simulated input signal and transmitting the simulated input signal to the intelligent function unit;
a debugging period instruction process of instructing the calculator to cause the input/output controller to process the input signal one step at a time or consecutively for the set period;
an output data storing process of storing the output signal received from the intelligent function unit; and
a displaying process of displaying a waveform of the output signal stored in the output data storing process.

8. The programmable logic controller system according to claim 7, wherein
the input data generation process includes generating the simulated input signal by using a graphical user interface, and
the debugging period instruction process includes instructing the calculator to cause the general circuit blocks to process the input signal one step at a time or consecutively for the set period by using a graphical user interface.

* * * * *